(12) United States Patent
Zeng et al.

(10) Patent No.: US 11,462,660 B2
(45) Date of Patent: Oct. 4, 2022

(54) DISPLAY PANEL AND DISPLAY DEVICE

(71) Applicants: Shanghai Tianma Micro-Electronics Co., Ltd., Shanghai (CN); Xiamen Tianma Micro-Electronics Co., Ltd., Xiamen (CN)

(72) Inventors: Yang Zeng, Shanghai (CN); Shihao Tang, Shanghai (CN); Yaodong Wu, Shanghai (CN); Xuelin Fan, Shanghai (CN)

(73) Assignees: Shanghai Tianma Micro-Electronics Co., Ltd., Shanghai (CN); Xiamen Tianma Micro-Electronics Co., Ltd., Xiamen (CN)

( * ) Notice: Subject to any disclaimer, the term of this patent is extended or adjusted under 35 U.S.C. 154(b) by 144 days.

(21) Appl. No.: 17/145,887

(22) Filed: Jan. 11, 2021

(65) Prior Publication Data

US 2022/0140184 A1 May 5, 2022

(30) Foreign Application Priority Data

Oct. 29, 2020 (CN) .......................... 202011187302.6

(51) Int. Cl.
*H01L 33/20* (2010.01)
*H01L 25/075* (2006.01)
*H01L 33/62* (2010.01)

(52) U.S. Cl.
CPC .......... *H01L 33/20* (2013.01); *H01L 25/0753* (2013.01); *H01L 33/62* (2013.01)

(58) Field of Classification Search
CPC ..... H01L 33/20; H01L 25/0753; H01L 33/62; H01L 25/167; H01L 33/60; G09F 9/33; G06F 3/0412
See application file for complete search history.

(56) References Cited

U.S. PATENT DOCUMENTS

| | | | |
|---|---|---|---|
| 2020/0066787 A1* | 2/2020 | Park | H01L 27/156 |
| 2021/0118944 A1* | 4/2021 | Han | H01L 33/0095 |
| 2021/0183957 A1* | 6/2021 | Zhang | H01L 27/323 |

FOREIGN PATENT DOCUMENTS

| | | |
|---|---|---|
| CN | 106684108 B | 10/2019 |
| CN | 111736388 A | 10/2020 |
| CN | 111769109 A | 10/2020 |

OTHER PUBLICATIONS

Chinese Office Action related to Application No. 202011187302.6 dated Mar. 2, 2022.

* cited by examiner

*Primary Examiner* — Victor A Mandala
(74) *Attorney, Agent, or Firm* — von Briesen & Roper, s.c.

(57) ABSTRACT

Disclosed are a display panel and a display device. The display panel includes a first substrate and a light-emitting substrate disposed opposite to each other. The first substrate includes a first base and a baffle wall layer, the first base includes a display region, and the baffle wall layer is located on a side of the first substrate and in the display region. The light-emitting substrate includes a second base, a eutectic layer and multiple micro light-emitting diodes. The eutectic layer is located on a side of the second base close to the first substrate. The multiple micro light-emitting diodes are located on a side of the eutectic layer close to the first substrate. The eutectic layer includes a first eutectic layer subsection and a second eutectic layer subsection, the first eutectic layer subsection is electrically connected to multiple micro light-emitting diodes.

19 Claims, 16 Drawing Sheets

DISPLAY PANEL AND DISPLAY DEVICE

CROSS-REFERENCE TO RELATED APPLICATIONS

This application claims priority to Chinese patent application No. 202011187302.6 filed with the CNIPA on Oct. 29, 2020, the disclosure of which is incorporated herein by reference in its entirety.

TECHNICAL FIELD

Embodiments of the present disclosure relate to the field of display technology, and in particular to a display panel and a display device.

BACKGROUND

Micro light-emitting diode (micro-LED) display panels have gained more and more attention due to their advantages of higher display brightness, better luminous efficiency, lower power consumption, and the like.

In the micro light-emitting diode display panels, in order to prevent the crosstalk of light beams emitted from adjacent micro light-emitting diodes, a baffle wall layer surrounding the micro light-emitting diodes is usually provided. However, the baffle wall layer and the micro light-emitting diodes are generally disposed on two substrates which are disposed opposite to each other, a height of the baffle wall layer is limited, and a large gap may exist between a side of the baffle wall layer close to a substrate where the micro light-emitting diode is located and this substrate, which not only causes that the light beams emitted from the adjacent micro light-emitting diodes to crosstalk with each other due to the gap, thus affecting the display effect, but also causes that due to a relatively large gap, the effective support cannot be provided when the display panels are subjected to external forces, thus affecting the quality of the display panels.

SUMMARY

Embodiments of the present disclosure provide a display panel and a display device to improve the quality of and the display effect of the display panel.

In an embodiment, the present disclosure provides a display panel. The display panel includes a first substrate and a light-emitting substrate disposed opposite to each other. The first substrate includes a first base and a baffle wall layer, the first base includes a display region, and the baffle wall layer is located on a side of the first substrate and in the display region. The light-emitting substrate includes a second base, a eutectic layer and multiple micro light-emitting diodes, the eutectic layer is located on a side of the second base close to the first substrate, and the multiple micro light-emitting diodes are located on a side of the eutectic layer close to the first substrate. The eutectic layer includes a first eutectic layer subsection and a second eutectic layer subsection. The first eutectic layer subsection is electrically connected to the multiple micro light-emitting diodes, and a vertical projection of the second eutectic layer subsection on a plane where the second base is located at least partially overlaps a vertical projection of the baffle wall layer on the plane where the second base is located.

In an embodiment, the present disclosure further provides a display device including the display panel provided in the first aspect.

DETAILED DESCRIPTION

Figure 1:
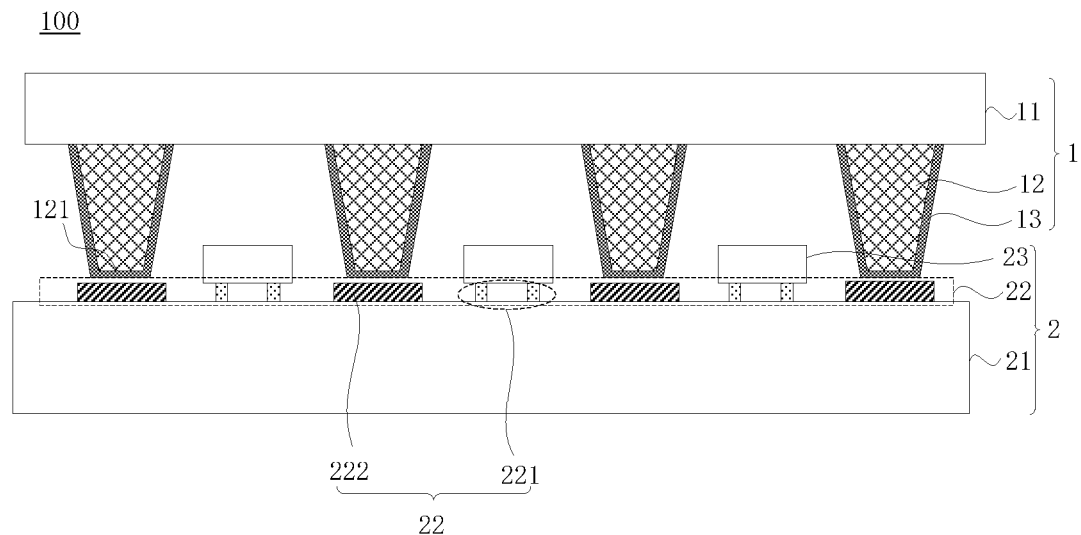
FIG. 1 is a schematic structural view of a display panel provided by an embodiment of the present disclosure.

The present disclosure will be further described in detail in conjunction with the drawings and embodiments below. It should be understood that the specific embodiments described herein are merely used for explaining the present disclosure and are not intended to limit the present disclosure. In addition, it should also be noted that, for ease of description, only some, but not all, of the structures related to the present disclosure are shown in the drawings.

Figure 2:
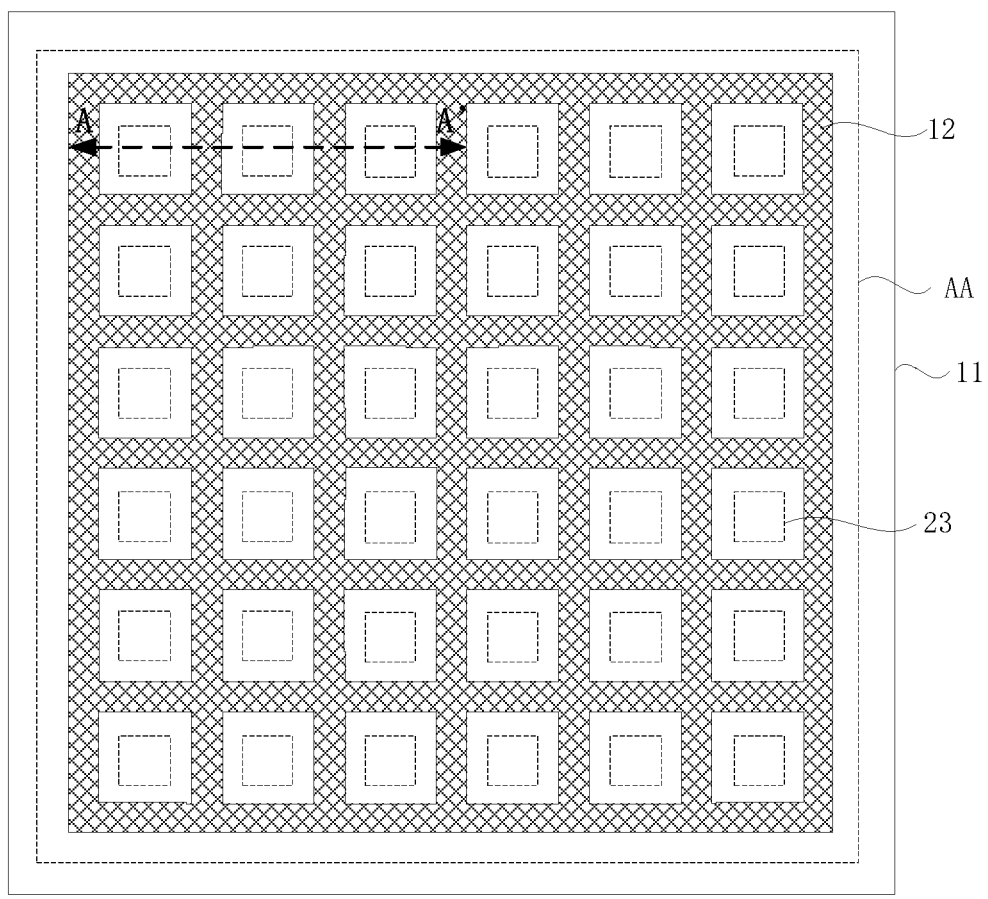
FIG. 2 is a schematic top view of a baffle wall layer in the display panel provided by an embodiment of the present disclosure.

FIG. 1 is a schematic structural view of a display panel provided by an embodiment of the present disclosure, and FIG. 2 is a schematic top view of a baffle wall layer in the display panel provided by an embodiment of the present disclosure. FIG. 1 may be, for example, a cross-sectional structural view of the display panel taken along AN of FIG. 2. As shown in FIGS. 1 and 2, a display panel 100 provided by the embodiment of the present disclosure includes a first substrate 1 and a light-emitting substrate 2 disposed opposite to each other. The first substrate 1 includes a first base 11 and a baffle wall layer 12, the first base 11 includes a display region AA, and the baffle wall layer 12 is located on a side of the first base 11 and in the display region AA. The light-emitting substrate 2 includes a second base 21, a eutectic layer 22 and multiple micro light-emitting diodes 23, the eutectic layer 22 is located on a side of the second base 21 close to the first substrate 1, the multiple micro light-emitting diodes 23 are located on a side of the eutectic layer 22 close to the first substrate 1, and the eutectic layer 22 includes a first eutectic layer subsection 221 and a second eutectic layer subsection 222. The first eutectic layer subsection 221 is electrically connected to the multiple micro light-emitting diodes 23, and a vertical projection of the second eutectic layer subsection 222 on a plane where the second base 21 is located at least partially overlaps a vertical projection of the baffle wall layer 12 on the plane where the second base 21 is located.

For the micro light-emitting diode display panel, the eutectic layer 22 generally refers to eutectic electrodes of the micro light-emitting diodes 23, and is used for electrically connecting electrodes (anodes and cathodes) of the micro light-emitting diodes 23 to corresponding signal lines in pixel driving circuits to achieve the transmission of a light-emitting control signal. In other words, the eutectic layer 22 typically only includes the first eutectic layer subsection 221 (only the first eutectic layer subsection 221 is kept when patterning the eutectic layer 22).

It should be understood that a spacing exists between a lower surface of the first substrate 1 and an upper surface of the light-emitting substrate 2 in the display panel. The baffle wall layer 12 may have a height less than the spacing between the first substrate 1 and the light-emitting substrate 2 due to the influence of the preparation process, so that a relatively large gap is formed between a lower surface of the baffle wall layer 12 and the upper surface of the light-emitting substrate 2, which causes the crosstalk between light beams emitted from adjacent micro light-emitting diodes 23, and meanwhile, and that the effective support cannot be provided due to the relatively large gap when the display panel is subjected to large external forces, thus damaging the display panel.

The embodiments of the present disclosure adopt the following schemes: the eutectic layer 22 is divided into the first eutectic layer subsection 221 and the second eutectic layer subsection 222, the first eutectic layer subsection 221 is still electrically connected to the micro light-emitting diodes 23 to achieve the transmission of the light-emitting control signal, and the second eutectic layer subsection 222 is correspondingly disposed on a side of the baffle wall layer 12 close to the light-emitting substrate 2. Besides, it is ensured that the vertical projection of the second eutectic layer subsection 222 on the plane where the second base 21 is located at least partially overlaps the vertical projection of the baffle wall layer 12 on the plane where the second base 21 is located, so that the second eutectic layer subsection 222 is used to fill at least part of the gap between the baffle wall layer 12 and the light-emitting substrate 2, so as to make up for the defect of an insufficient height of the baffle wall layer 12. Since the second eutectic layer subsection 222 does not have light transmittance, a part of the light may be reflected by the second eutectic layer subsection 222, crosstalk light beams between adjacent micro light-emitting diodes are further reduced, thus improving the display effect. Meanwhile, since the second eutectic layer subsection 222 fills at least part of the gap between the baffle wall layer 12 and the light-emitting substrate 2, the gap between the baffle wall layer 12 and the light-emitting substrate 2 is reduced, so that the effective support can be provided for the first substrate 1 when the display panel is subject to external forces, thus improving the quality of the display panel.

As shown in FIG. 2, the baffle wall layer 12 has a grid-like structure, in this embodiment, the vertical projection of the second eutectic layer subsection 222 on the plane where the second base 21 is located at least partially overlaps the vertical projection of the baffle wall layer 12 on the plane where the second base 21 is located, for example, the following schemes may be adopted: a scheme one, it is possible to also dispose the second eutectic layer subsection 222 to be grid-like corresponding to the structure of the baffle wall layer 12, as long as the vertical projection of the second eutectic layer subsection 222 on the plane where the second base 21 is located and the vertical projection of the baffle wall layer 12 on the plane where the second base 21 is located are ensured to have an overlapping portion, and an area of the overlapping portion is not limited; and a scheme two, it is also possible to only provide the second eutectic layer subsection 222 corresponding to a partial region of the grid-like baffle wall layer 12, so that the vertical projection of the second eutectic layer subsection 222 on the plane where the second base 21 is located and the vertical projection of the baffle wall layer 12 on the plane where the second base 21 is located have the overlapping portion. Those skilled in the art may set the structure of the second eutectic layer subsection 222 according to functional requirements for the second eutectic layer subsection 222, which is not limited in the embodiments of the present disclosure, and will be exemplified later.

Figure 3:
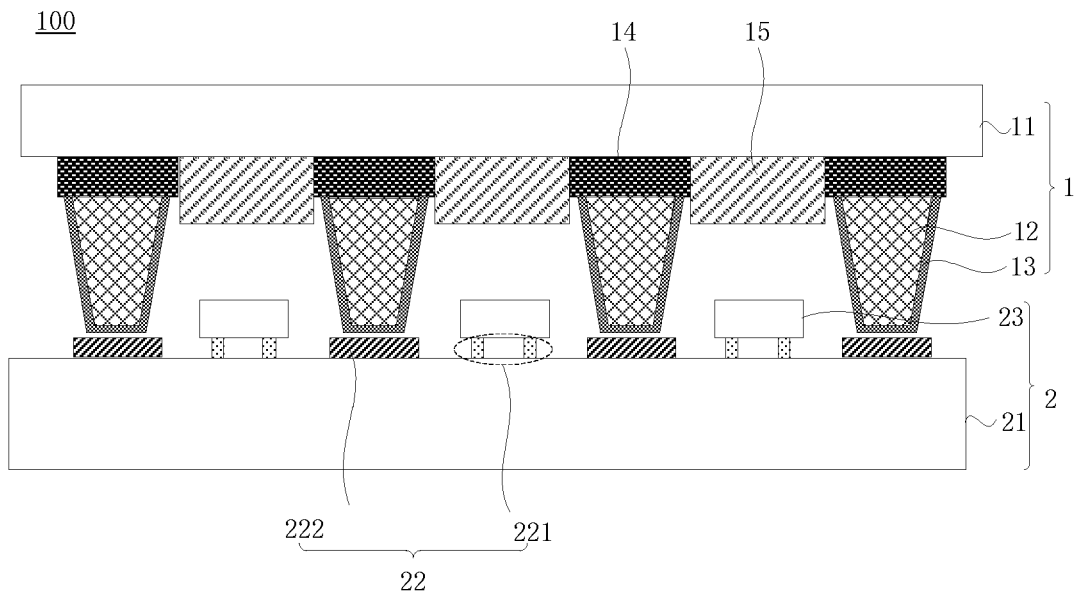
FIG. 3 is a schematic structural view of another display panel provided by an embodiment of the present disclosure.

It should be noted that, in this embodiment, the structure of the first substrate 1 may be determined according to a type of the display panel (or a type of the micro light-emitting diodes 23). Exemplary, if the multiple micro light-emitting diodes 23 are micro light-emitting diodes having different colors, the first substrate 1 mainly includes the first base 11, the baffle wall layer 12 and a polaroid (not shown), so that the display of a color picture may be achieved. If all micro light-emitting diodes 23 have the same emitted light color, the first substrate 1 may be a color film substrate. Exemplary, FIG. 3 is a schematic structural view of another display panel provided by an embodiment of the present disclosure, it shows a structure that the first substrate 1 is the color film substrate. As shown in FIG. 3, the first substrate 1 further includes a black matrix 14 and a color resistance unit 15. The first substrate 1 may be a regular color film substrate, the color resistance unit of the first substrate 1 includes a red color resistance, a green color resistance and a blue color resistance, and correspondingly, light emitted by the micro light-emitting diodes 23 in the light-emitting substrate 2 may be white light. Moreover, the first substrate 1 may also be a quantum dot color film substrate, the color resistance unit of the first substrate 1 is a quantum dot color resistance unit and includes a red color resistance, a green color resistance and a scattering color resistance, and correspondingly, light emitted by the micro light-emitting diodes 23 in the light-emitting substrate 2 is blue light. Those skilled in the art may design by themselves as required, and the type of the first substrate 1 is not limited in the embodiments of the present disclosure.

According to the embodiments of the present disclosure, the eutectic layer in the light-emitting substrate is divided into the first eutectic layer subsection and the second eutectic layer subsection, the first eutectic layer subsection is electrically connected to the micro light-emitting diodes to achieve the transmission of the light-emitting control signal; and meanwhile, the vertical projection of the second eutectic layer subsection on the plane where the second base is located and the vertical projection of the baffle wall layer on the plane where the second base is located are enabled to have the overlapping portion, so that the second eutectic layer subsection may be used to fill at least part of the gap between the baffle wall layer and the light-emitting substrate, so as to make up for the gap generated due to the insufficient height of the baffle wall layer. Moreover, since the second eutectic layer subsection does not have light transmittance, a part of the light can be reflected by the second eutectic layer subsection, the crosstalk light beams between adjacent micro light-emitting diodes are further reduced, thus improving the display effect is improved; meanwhile, due to the existence of the second eutectic layer subsection, the gap between the baffle wall layer and the light-emitting substrate is reduced, the effective support can be provided when the display panel is subjected to the external forces, thus improving the quality of the display panel.

The structure of the second eutectic layer subsection 222 may be adaptively designed according to its function as described above. Hereinafter, on the basis of the embodiments described above, the structure of the second eutectic layer subsection 222 is first optimized for functions of preventing the light crosstalk (optical blocking) and providing the mechanical support as follows.

Figure 4:
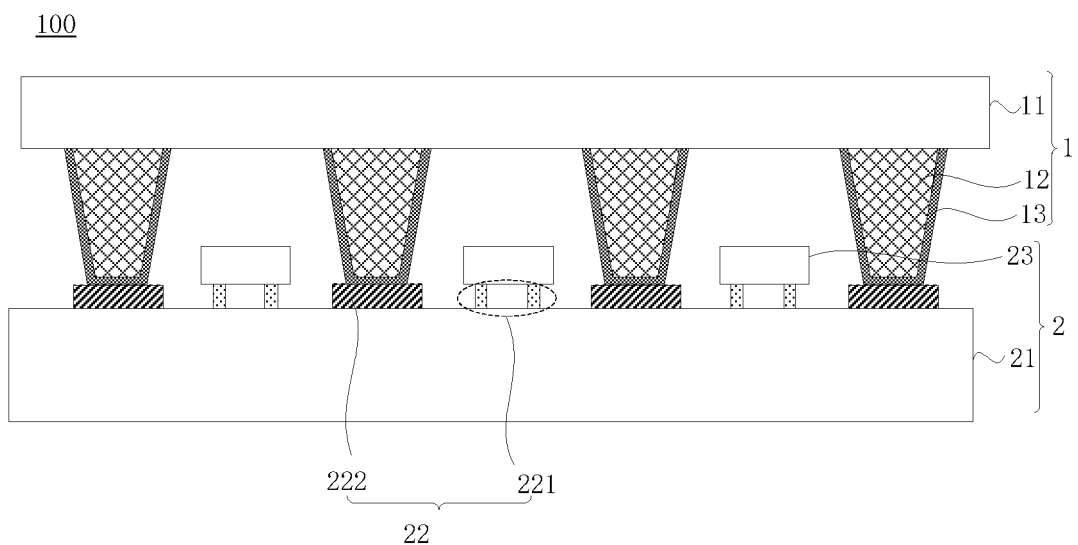
FIG. 4 is a schematic structural view of a display panel provided by another embodiment of the present disclosure.

FIG. 4 is a schematic structural view of a display panel provided by another embodiment of the present disclosure, at least part of the baffle wall layer 12 is in contact with the second eutectic layer subsection 222.

When the baffle wall layer 12 is in contact with the second eutectic layer subsection 222, the baffle wall layer 12 and the second eutectic layer subsection 222 may be utilized to completely block emitted light beams of the micro light-emitting diodes 23, and the light crosstalk of adjacent micro light-emitting diodes is avoided. In addition, since the baffle wall layer 12 is in contact with the second eutectic layer subsection 222, the first substrate 1 may be supported when the display panel is subjected to external forces, so that the display panel is prevented from being damaged. In an exemplary embodiment, all of the baffle wall layer 12 is in contact with the second eutectic layer subsection 222. According to the present embodiment, at least part of the baffle wall layer 12 is in contact with the second eutectic layer 22, so that the light crosstalk can be effectively prevented, powerful support can be provided for the first substrate 1, and the quality of the display panel is improved.

As shown in FIG. 1, the baffle wall layer 12 includes a first surface 121 close to a side of the light-emitting substrate 2; and the vertical projection of the second eutectic layer subsection 222 on the plane where the second base 21 is located covers a vertical projection of the first surface 121 on the plane where the second base 21 is located.

With this arrangement, on the one hand, it may ensure that the second eutectic layer subsection 222 may provide relatively uniform support effect to different regions of the baffle wall layer 12, and on the other hand, when light beams emitted from the micro light-emitting diodes 23 are directed to a region between the lower surface of the baffle wall layer 12 and the upper surface of the light-emitting substrate 2, an upper surface and a sidewall of the second eutectic layer subsection 222 may reflect the light beams, so that the effect of preventing the light crosstalk has been promoted.

Figure 5:
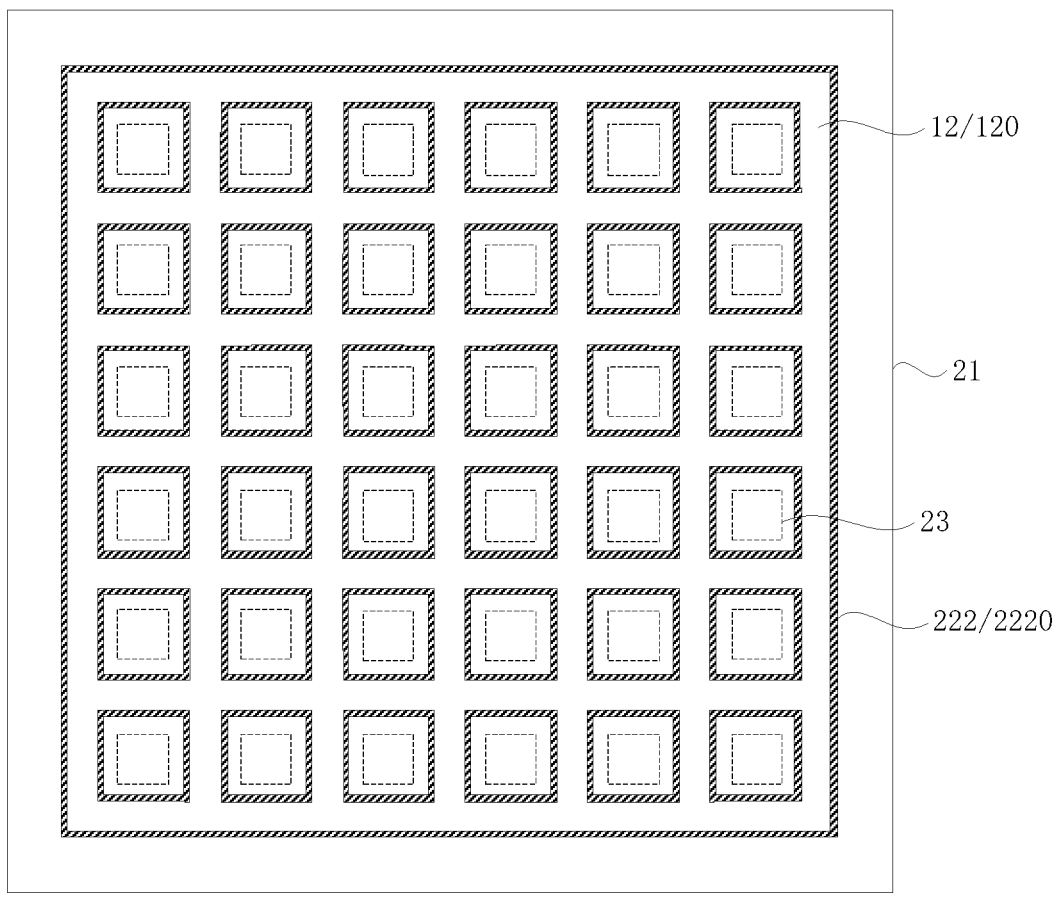
FIG. 5 is a schematic structural view of a second eutectic layer subsection in a display panel provided by another embodiment of the present disclosure.

FIG. 5 is a schematic structural view of a second eutectic layer subsection in a display panel provided by another embodiment of the present disclosure. As shown in FIG. 5, the vertical projection of the baffle wall layer 12 on the plane where the second base 21 is located is a first continuous grid 120; the vertical projection of the second eutectic layer subsection 222 on the plane where the second base 21 is located is a second continuous grid 2220; and the first continuous grid 120 at least partially overlaps the second continuous grid 2220.

Exemplary, FIG. 5 is illustrated by using an example in which the second continuous grid 2220 covers the first continuous grid 120. In other embodiments, the first continuous grid 120 and the second continuous grid 2220 have an overlapping portion, which is not limited in the embodiments of the present disclosure. According to the present embodiment, the second eutectic layer subsection 222 is set to have the grid-like structure, so that the micro light-emitting diodes 23 may be completely surrounded, the crosstalk light beams between adjacent micro light-emitting diodes 23 can be reduced from all directions, thus further improving the display effect.

Figure 6:
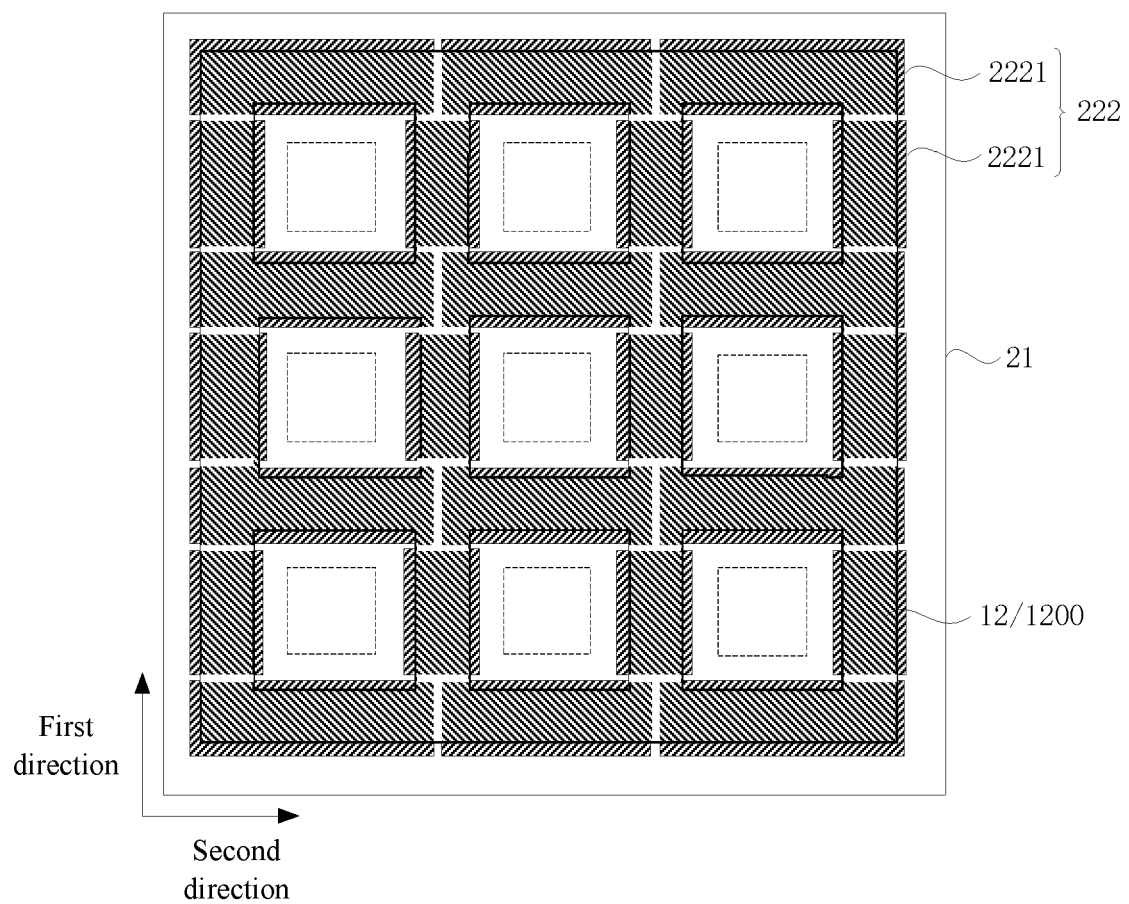
FIG. 6 is a schematic structural view of a second eutectic layer subsection in a display panel provided by another embodiment of the present disclosure.

FIG. 6 is a schematic structural view of a second eutectic layer subsection in a display panel provided by another embodiment of the present disclosure, as shown in FIG. 6, the vertical projection of the baffle wall layer 12 on the plane where the second base 21 is located is a third continuous grid 1200; the second eutectic layer subsection 222 includes multiple first eutectic structures 2221, a part of the multiple first eutectic structures 2221 are arranged at intervals in a first direction and extend in a second direction; the other part of the multiple first eutectic structures 2221 are arranged at intervals in the second direction and extend in the first direction. The first direction intersects with the second direction, and the first direction and the second direction are both parallel to a plane where the first base 11 is located, and a vertical projection of the multiple first eutectic structures 2221 on the plane where the second base 21 is located at least partially overlaps the third continuous grid 1200.

According to the present embodiment, the second eutectic layer subsection 222 is disposed to be the multiple separated first eutectic structures 2221, so that when the first substrate 1 and the light-emitting substrate 2 are laminated, the flowability of a laminating glue can be improved, the influence of bubbles on the quality of the display panel is avoided, and the good stability of the display panel is ensured.

Furthermore, the vertical projection of the multiple first eutectic structures 2221 on the plane where the second base 21 is located at least partially overlaps the third continuous grid 1200, which may be that the vertical projection, on the plane where the second base 21 is located, of the baffle wall layer 12 extending in the first direction in the third continuous grid 1200 at least partially overlaps the vertical projection, on the plane where the second base 21 is located, of the multiple first eutectic structures 2221 extending in the first direction; and that the vertical projection, on the plane where the second base 21 is located, of the baffle wall layer 12 extending in the second direction in the third continuous grid 1200 at least partially overlaps the vertical projection, on the plane where the second base 21 is located, of the multiple first eutectic structures 2221 extending in the second direction.

Figure 7:
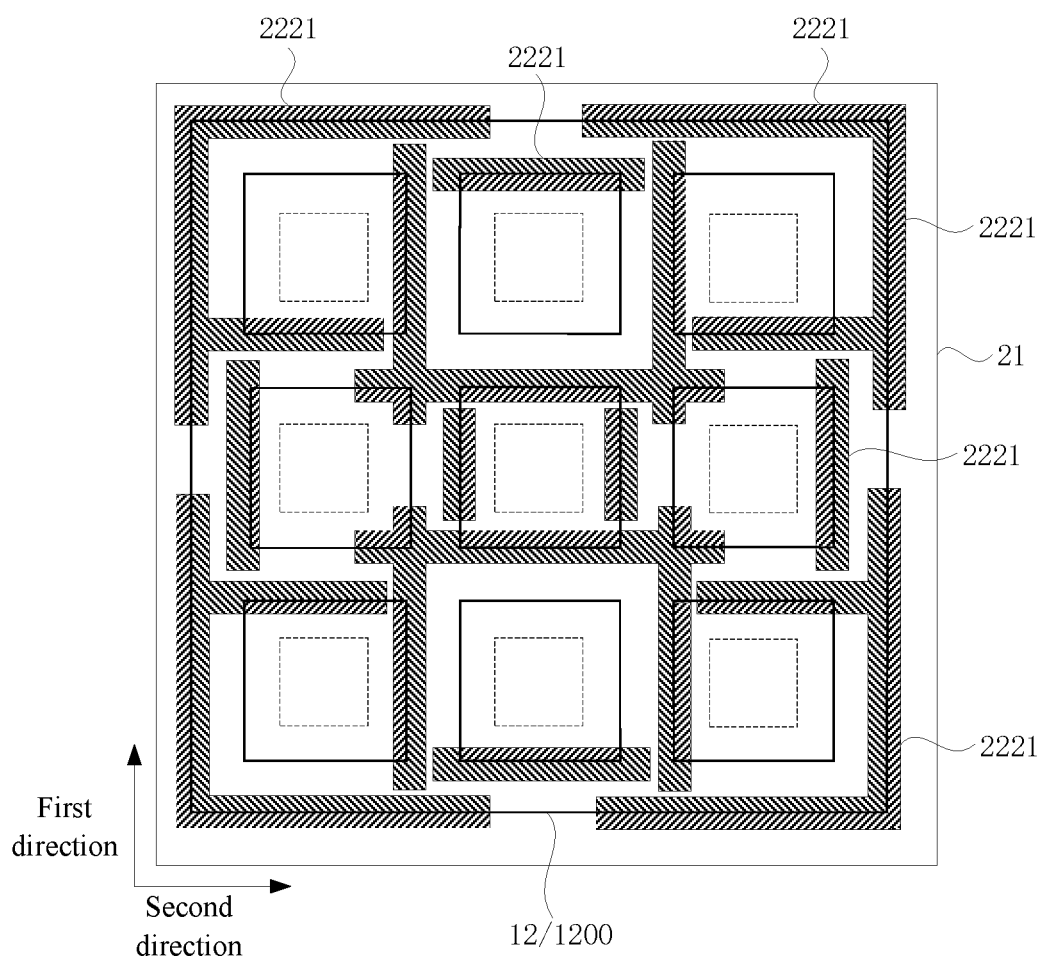
FIG. 7 is a schematic structural view of a second eutectic layer subsection in a display panel provided by another embodiment of the present disclosure.

On the basis of the embodiments described above, FIG. 7 is a schematic structural view of a second eutectic layer subsection in a display panel provided by another embodiment of the present disclosure. As shown in FIG. 7, at least two first eutectic structures, which extend in the first direction and are adjacent to each other in the first direction, of the multiple first eutectic structures 2221 are staggered in the second direction, vertical projections of at least two first eutectic structures 2221, which extend in the first direction and are adjacent to each other in the first direction, on a first plane partially overlap, and the first plane is parallel to the first direction and perpendicular to the second base 21; at least two first eutectic structures, which extend in the second direction and are adjacent to each other in the second direction, of the multiple first eutectic structures 2221 are staggered in the first direction, vertical projections of at least two first eutectic structures 2221, which extend in the second direction and are adjacent to each other in the second direction, on a second plane partially overlap, and the second plane is parallel to the second direction and perpendicular to the second base 21.

With continued reference to FIG. 6, the optical blocking capability of the second eutectic layer subsection 222 may be lost due to the presence of gaps between the two first eutectic structures 2221 in this scheme. So, the scheme shown in FIG. 7 may be adopted. The at least two first eutectic structures 2221 adjacent in a same direction are staggered, so that the occurrence of bubbles is avoided during the lamination, the optical blocking capability of the second eutectic layer 22 can also be ensured, and the display effect is improved.

In summary, the structure of the second eutectic layer subsection 222 is described in detail in the above embodiments from the perspective of improving the optical blocking capability of the second eutectic layer subsection 222. It should be noted that, without contradiction, the schemes of the above-described embodiments may be combined with one another to achieve the optimal optical blocking capability.

In addition, in consideration of the conductivity of the eutectic layer 22, other electrical functions, such as reusing as an electrically conductive structure or a touch electrode, may also be implemented using the second eutectic layer subsection 222, as detailed in the following embodiments.

Figure 8:
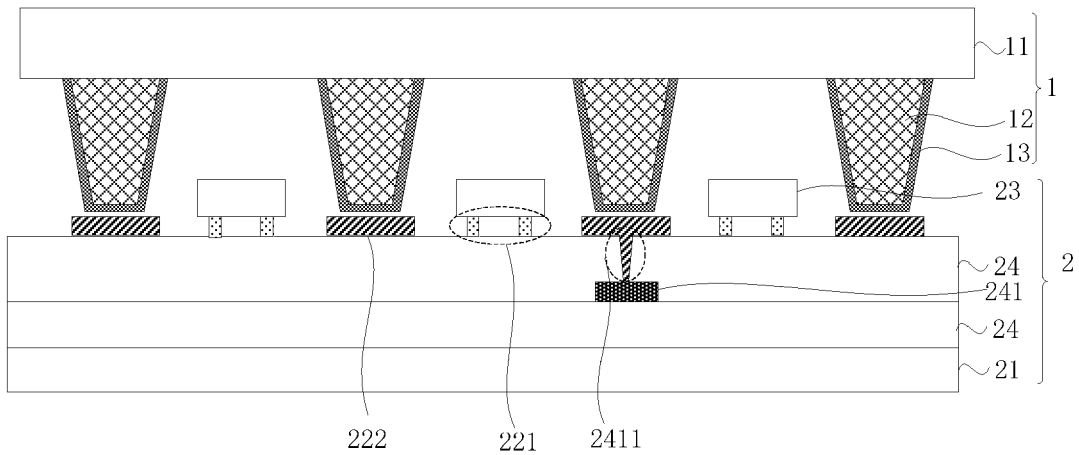
FIG. 8 is a schematic structural view of a display panel provided by another embodiment of the present disclosure.

FIG. 8 is a schematic structural view of a display panel provided by another embodiment of the present disclosure, as shown in FIG. 8, the light-emitting substrate 2 further includes a driving circuit layer located between a film layer where the second base 21 is located and a film layer where the eutectic layer 22 is located; the driving circuit layer includes multiple conductive layers 24, and at least one of the multiple conductive layers 24 is provided with a first power signal line 241; at least part of the second eutectic layer subsection 222 is electrically connected to the first power signal line 241 through a first via hole 2411, and the at least part of the second eutectic layer subsection 222 transmits a first power signal.

The first power signal line 241 may be understood as a high-level power supply signal line. FIG. 8 is illustrated by using an example in which part of the second eutectic layer subsection 222 is electrically connected to the first power signal line 241 through the first via hole 2411, in other embodiments, all of the second eutectic layer subsection 222 may also be electrically connected to the first power signal line 241, which is not limited in the embodiments of the present disclosure. According to the embodiments of the present disclosure, at least part of the second eutectic layer subsection 222 is electrically connected to the first power signal line 241, so that the second eutectic layer subsection 222 can be connected to the first power signal line 241 in parallel, which can reduce the wiring resistance, thereby being conducive to reducing the loss of the first power signal in the transmission process, and reducing the driving power consumption of the display panel, and meanwhile, improving the display effect of the display panel.

Figure 9:
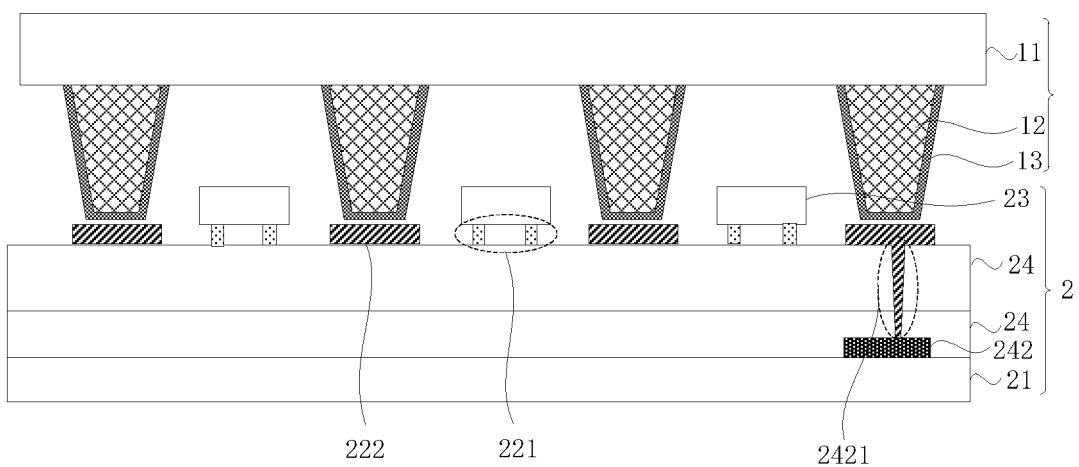
FIG. 9 is a schematic structural view of a display panel provided by another embodiment of the present disclosure.

FIG. 9 is a schematic structural view of a display panel provided by another embodiment of the present disclosure, the light-emitting substrate 2 further includes a driving circuit layer located between a film layer where the second base 21 is located and a film layer where the eutectic layer 22 is located; the driving circuit layer includes multiple conductive layers 24, and at least one of the multiple conductive layers 24 is provided with a second power signal line 242; at least part of the second eutectic layer subsection 222 is electrically connected to the second power signal line 242 through a second via hole 2421, and a second power signal is transmitted in at least part of the second eutectic layer subsection 222.

The second power signal line 242 may be understood as a low-level power supply signal line. FIG. 9 is illustrated by using an example in which part of the second eutectic layer subsection 222 is electrically connected to the second power signal line 242 through the second via hole 2421, in other embodiments, all of the second eutectic layer subsection 222 may also be electrically connected to the second power signal line 242, which is not limited in the embodiments of the present disclosure. According to the embodiments of the present disclosure, at least part of the second eutectic layer subsection 222 is electrically connected to the first power signal line 241, so that the second eutectic layer subsection 222 can be connected to the second power signal line 242 in parallel, which can reduce the wiring resistance, thereby being conducive to reducing the loss of the second power signal in the transmission process, and reducing the driving power consumption of the display panel, and meanwhile, improving the display effect of the display panel.

Figure 10:
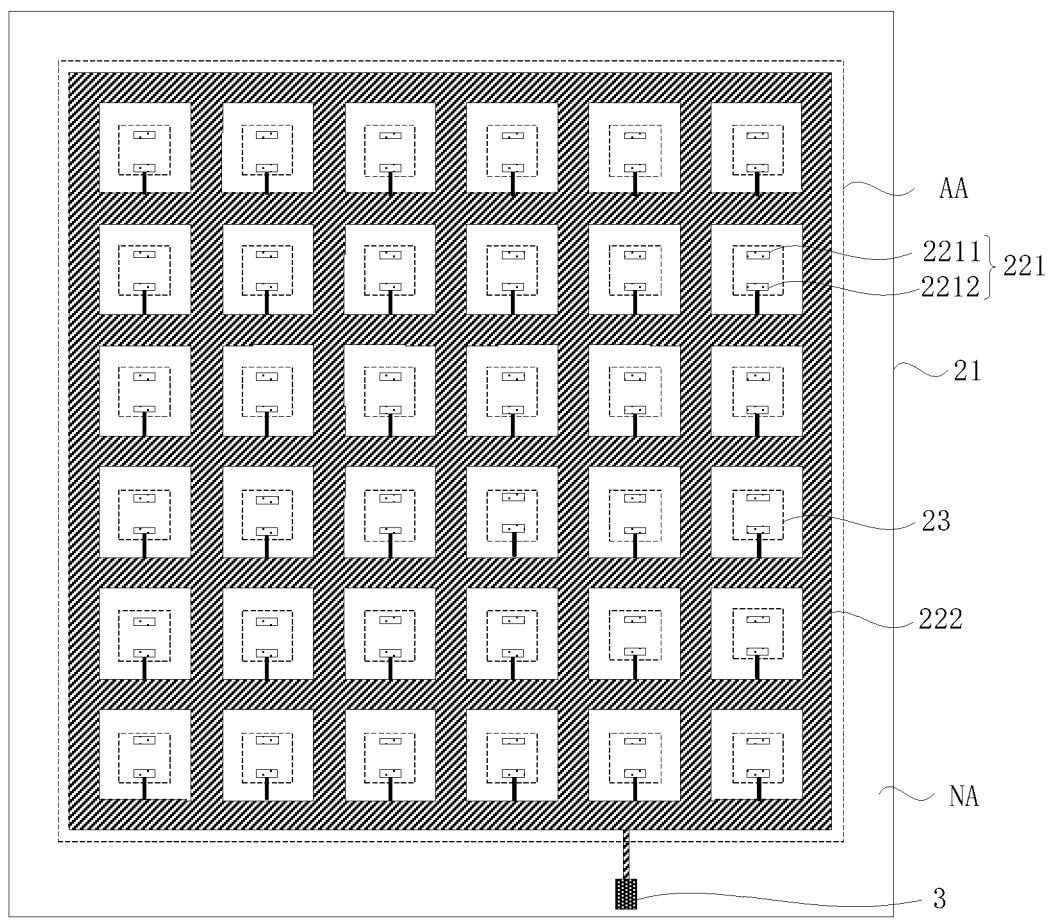
FIG. 10 is a schematic structural view of a eutectic layer in a display panel provided by yet another embodiment of the present disclosure.

FIG. 10 is a schematic structural view of a eutectic layer in a display panel provided by another embodiment of the present disclosure. As shown in FIG. 10, at least part of the second eutectic layer subsection 222 is electrically connected to a second power signal terminal 3.

Illustratively, FIG. 10 is illustrated by using an example in which all of the second eutectic layer subsection 222 is electrically connected to the second power signal terminal 3. In other embodiments, it is possible that part of the second eutectic layer subsection 222 is electrically connected to the second power signal terminal 3, which is not limited in the embodiments of the present disclosure. According to the embodiments of the present disclosure, at least part of the second eutectic layer subsection 222 is electrically connected to the second power signal terminal 3, so that a second power signal may be transmitted in the second eutectic layer subsection 222 electrically connected to the second power signal terminal 3.

It should be noted that when the second eutectic layer subsection 222 is electrically connected to the second power signal terminal 3, the second power signal line 242 may be provided in the conductive layers 24, or the second power signal line 242 may not be provided, and two different manners are described below.

As one of the implementation manners, when the second eutectic layer subsection 222 is electrically connected to the second power signal terminal 3, the second power signal line 242 may be provided in the conductive layers 24, and at this time, only the second power signal is transmitted in both the second eutectic layer subsection 222 and the second power signal line 242, namely, the second eutectic layer subsection 222 and the second power signal line 242 are disposed in parallel, which can reduce the wiring resistance, thereby being conducive to reducing the loss of the second power signal in the transmission process, and reducing the driving power consumption of the display panel, and meanwhile, improving the display effect of the display panel.

As the other of the implementation manners, the light-emitting substrate 2 further includes the driving circuit layer located between the film layer where the second base 21 is located and the film layer where the eutectic layer 22 is located; the drive circuit layer includes multiple conductive layers 24, and none of the multiple conductive layers 24 is provided with the second power signal line 242. With this arrangement, the second eutectic layer subsection 222 may be utilized to replace the second power signal line 242 for transmitting the second power signal, so that the number of wirings in the conductive layers 24 may be reduced, and the wiring difficulty may be reduced.

Further, in the pixel driving circuit, cathodes of the micro light-emitting diodes 23 receive the second power signal. Thus, based on any one of the embodiments described above, regardless of in which manner the second eutectic layer subsection 222 transmitting the second power signal, the first eutectic layer subsection 221 electrically connected to the cathodes of the micro light-emitting diodes 23 may be electrically connected to the second eutectic layer subsection 222, to achieve the transmission of the second power signal. The following description will be given by using an example in which the second eutectic layer subsection 222 is electrically connected to the second power signal terminal 3.

With continued reference to FIG. 10, the first eutectic layer subsection 221 includes second eutectic structures 2211 and third eutectic structures 2212, the second eutectic structure 2211 is electrically connected to the anode of the micro light-emitting diodes 23, the third eutectic structures 2212 are electrically connected to the cathodes of the micro light-emitting diodes 23 (not shown); the second power signal is transmitted in the second eutectic layer subsection 222, and the second eutectic layer subsection 222 is electrically connected to the third eutectic structures 2212.

In the structure shown in FIG. 10, the second eutectic layer subsection 222 performs the function of transmitting the second power signal in the manner of an electrical connection to the second power signal terminal 3. In other embodiments, the second eutectic layer subsection 222 may also be electrically connected to the second power signal line 242 through the second via hole 2421 to achieve the function of transmitting the second power signal, which is not limited in the embodiments of the present disclosure.

The third eutectic structures 2212 are typically electrically connected to the second power signal line 242 in the conductive layers 24 through the via hole to achieve the transmission of the second power signal. In this embodiment, the second eutectic layer subsection 222 and the third eutectic structures 2212 are disposed on a same layer, so that compared with the via hole scheme, the scheme in this embodiment that the second eutectic layer subsection 222 is electrically connected to the third eutectic structures 2212 to achieve the transmission of the second power signal is simpler in process and higher in preparation efficiency.

Figure 11:
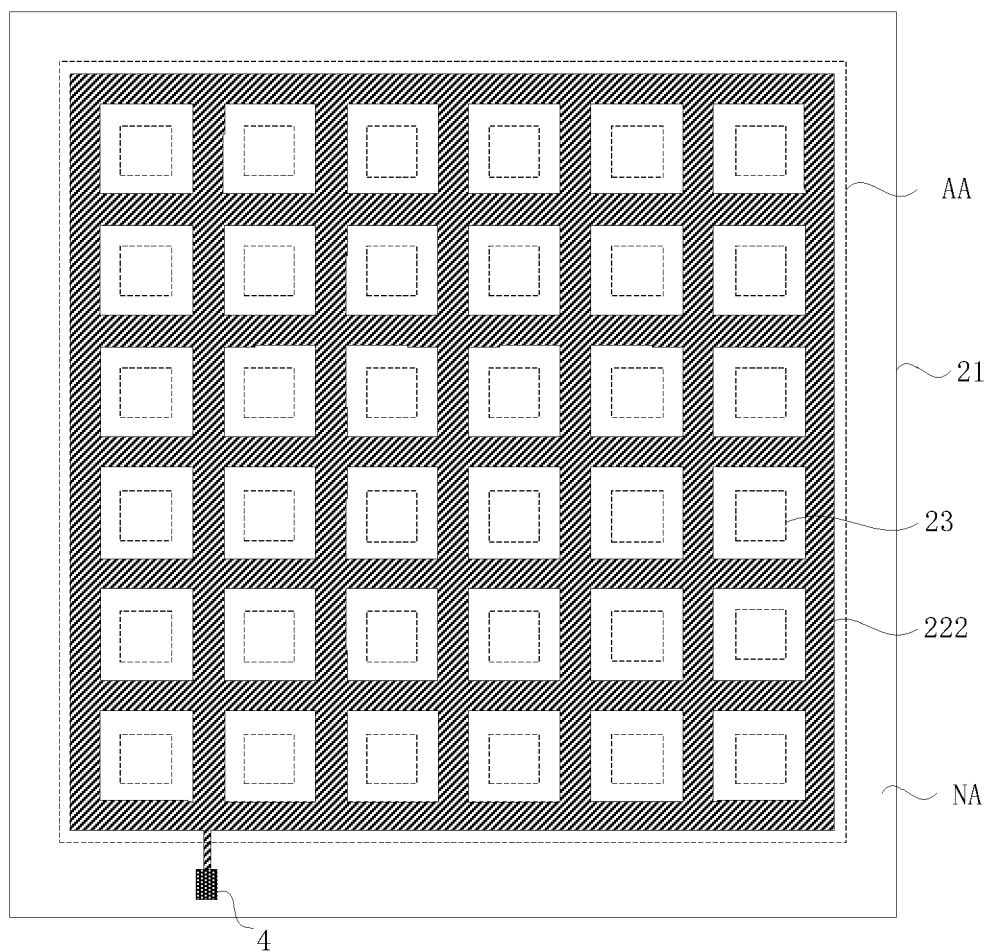
FIG. 11 is a schematic structural view of a second eutectic layer subsection in a display panel provided by another embodiment of the present disclosure.

FIG. 11 is a schematic structural view of a second eutectic layer subsection in a display panel provided by another embodiment of the present disclosure. As shown in FIG. 11, at least part of the second eutectic layer subsection 222 is electrically connected to an electrostatic protection signal terminal 4.

FIG. 11 is illustrated by using an example in which all of the second eutectic layer subsection 222 is electrically connected to the electrostatic protection signal terminal 4. In other embodiments, it is possible that part of the second eutectic layer subsection 222 is electrically connected to the electrostatic protection signal terminal 4, which is not limited in the embodiments of the present disclosure. According to this embodiment, at least part of the second eutectic layer subsection 222 is electrically connected to the electrostatic protection signal terminal 4, and the second eutectic layer subsection 222 may be used for replacing an electrostatic protection layer, so that the electrostatic protection effect may be ensured, the number of metal film layers can be reduced, and the thickness of the display panel is reduced.

In summary, the second eutectic layer subsection 222 may also be used for the transmission of electrical signals, such as the transmission of a first power signal, a second power signal, or an electrostatic protection signal, which may be selectively set by those skilled in the art and is not limited in the embodiments of the present disclosure.

In addition, the second eutectic layer subsection 222 may also be multiplexed as a touch electrode or a cross-bridge structure in a touch layer, so that the touch layer does not need to be specially disposed on a light-emitting side of the first substrate 1 or the setting manner of the touch layer is simplified, and the thickness of the display panel can be reduced. The touch scheme in the display panel may be roughly divided into the following three types: a mutual-capacitive touch scheme in which the touch driving electrode and the touch sensing electrode are disposed on a same layer, a mutual-capacitive touch scheme in which the touch driving electrode and the touch sensing electrode are disposed on different layers, and a self-capacitive touch scheme. The structure of the display panel is described in further detail on the basis of the above-described three touch schemes below.

Figure 12:
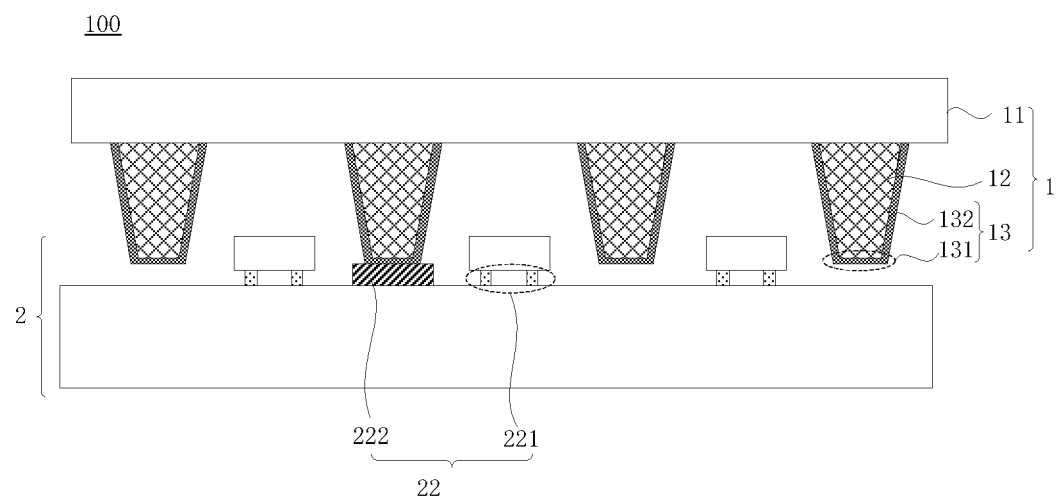
FIG. 12 is a schematic structural view of a display panel provided by yet another embodiment of the present disclosure.
Figure 13:
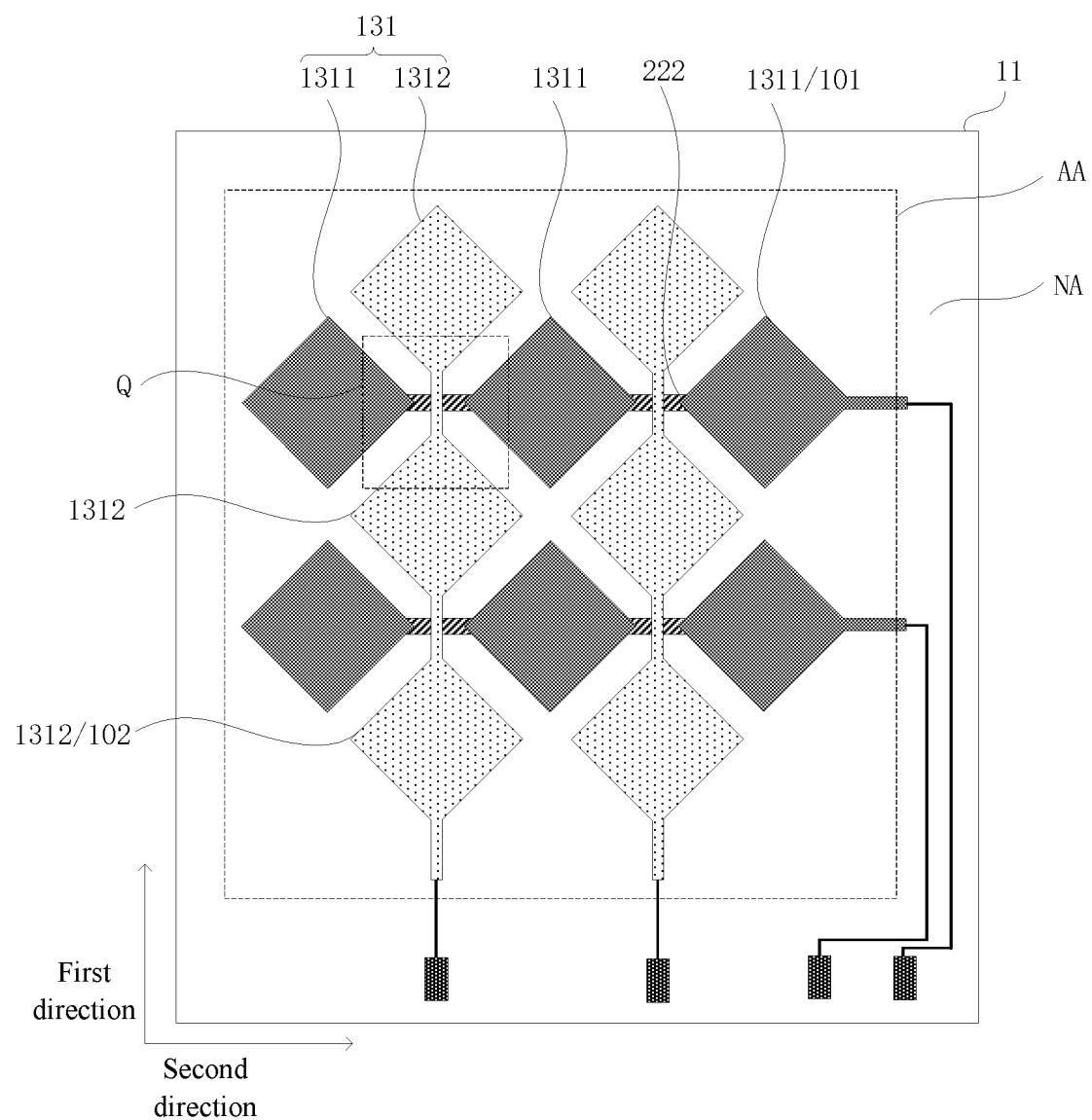
FIG. 13 is a schematic structural view of a touch electrode provided by an embodiment of the present disclosure.
Figure 14:
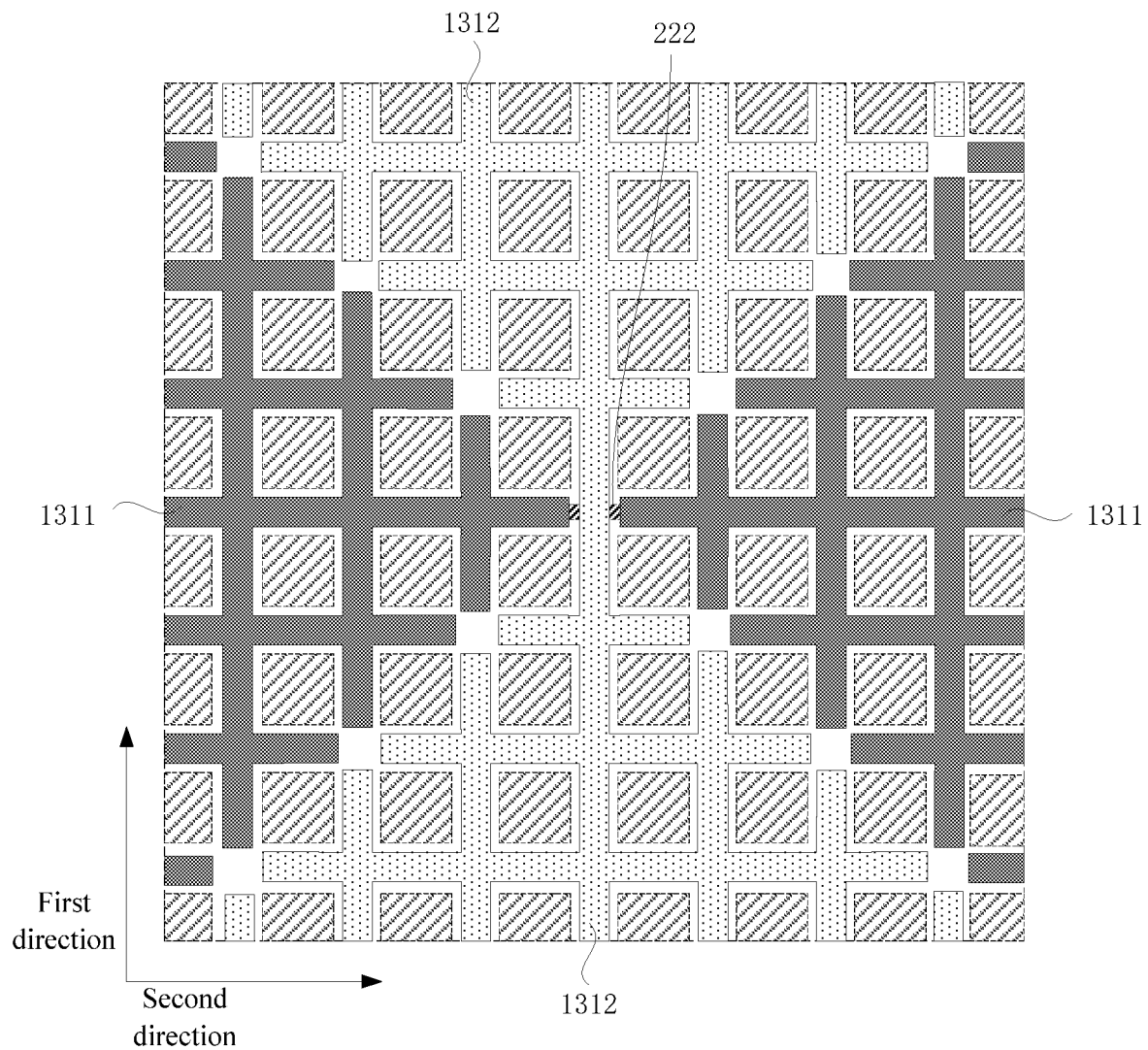
FIG. 14 is an enlarged structural schematic view of the region Q in FIG. 13.

The first touch scheme is the mutual-capacitive touch scheme in which the touch driving electrode and the touch sensing electrode are disposed on the same layer. As shown in FIGS. 12 to 14, FIG. 12 is a schematic structural view of a display panel provided by another embodiment of the present disclosure; FIG. 13 is a schematic structural view of a touch electrode provided by an embodiment of the present disclosure; FIG. 14 is an enlarged structural schematic view of the region Q in FIG. 13. The first substrate 1 further includes a reflective metal layer 13, the reflective metal layer 13 includes at least a first reflective subsection 131, and the first reflective subsection 131 covers a first surface 121 on a side of the baffle wall layer 12 close to the light-emitting substrate 2; the first reflective subsection 131 includes multiple first metal subsections 1311 and multiple second metal subsections 1312. On the first surface 121, every two adjacent first metal subsections of the multiple first metal subsections 1311 are independently disposed, and every two second metal subsections, which are adjacent in the first direction, of the multiple second metal subsections 1312 are connected to each other; the multiple first metal subsections 1311 are multiplexed as first-type touch electrodes 101, and the multiple second metal subsections 1312 are multiplexed as second-type touch electrodes 102; every two first metal subsections, which are adjacent in the second direction, of the multiple first metal subsections 1311 are electrically connected through the second eutectic layer subsection 222.

The reflective metal layer 13 covers a surface of the baffle wall layer 12, which improves the utilization rate of light emitted by the micro light-emitting diode 23, prevents the baffle wall layer 12 from absorbing the light, and meanwhile, the reflective metal layer 13 can also play a role of optical blocking. As shown in FIG. 12, in addition to the first reflective subsection 131, the reflective metal layer 13 further includes a second reflective subsection 132 covering a sidewall of the baffle wall layer 12.

On the basis of the good conductive characteristic of the reflective metal layer 13, the reflective metal layer 13 covering a bottom surface of the baffle wall layer 12 may be patterned, which enables the reflective metal layer 13 to be multiplexed as touch electrodes while ensuring the function of the reflective metal layer 13 preventing the light crosstalk, therefore, the effects of reducing the thickness of the display panel and simplifying the preparation process are achieved.

It should be understood that an original topography of the reflective metal layer 13 (i.e., the first reflective subsection 131) covering the bottom surface of the baffle wall layer 12 is the same as a top topography of the baffle wall layer 12 (as shown in FIG. 2), and that in the embodiments of the present disclosure, the first reflective subsection 131 is patterned to form multiple first metal subsections 1311 and multiple second metal subsections 1312 (as shown in FIG. 13), in this way, the first metal subsections 1311 may be multiplexed as first-type touch electrodes 101 (touch driving electrodes or touch sensing electrodes), and the second metal subsections 1312 may be multiplexed as second-type touch electrodes 102 (touch sensing electrodes or touch driving electrodes), to form the mutual capacitance type touch electrodes. As the first metal subsections 1311 and the second metal subsections 1312 are located on a same film layer, and an extending direction of first metal subsections 1311 in each row and an extending direction of second metal subsections 1312 in each column intersect, at least one of the first metal subsections 1311 or the second metal subsections 1312 need to be independently disposed to achieve the purpose that the first-type touch electrodes 101 and the second-type touch electrodes 102 may independently transmit touch signals, and an electrical connection of adjacent touch electrodes is achieved by means of other film layers. In this embodiment, every two second metal subsections 1312 adjacent in the first direction are connected to each other, i.e., they are connected through the first reflective subsection 131 remained between these two second metal subsections 1312; the first metal subsections 1311 are independently disposed, and every two first metal subsections 1311 adjacent in the second direction are electrically connected through the second eutectic layer subsection 222. That is, in the present touch scheme, the second eutectic layer subsection 222 is multiplexed as the cross-bridge structure.

As can be seen from FIG. 13 and FIG. 14, when the second eutectic layer subsection 222 is multiplexed as the cross-bridge structure, the second eutectic layer subsection 222 is disposed only in the region where the cross-bridge connection is needed, which would greatly lose the optical blocking function of the second eutectic layer subsection 222. So, the following schemes may be adopted.

Figure 15:
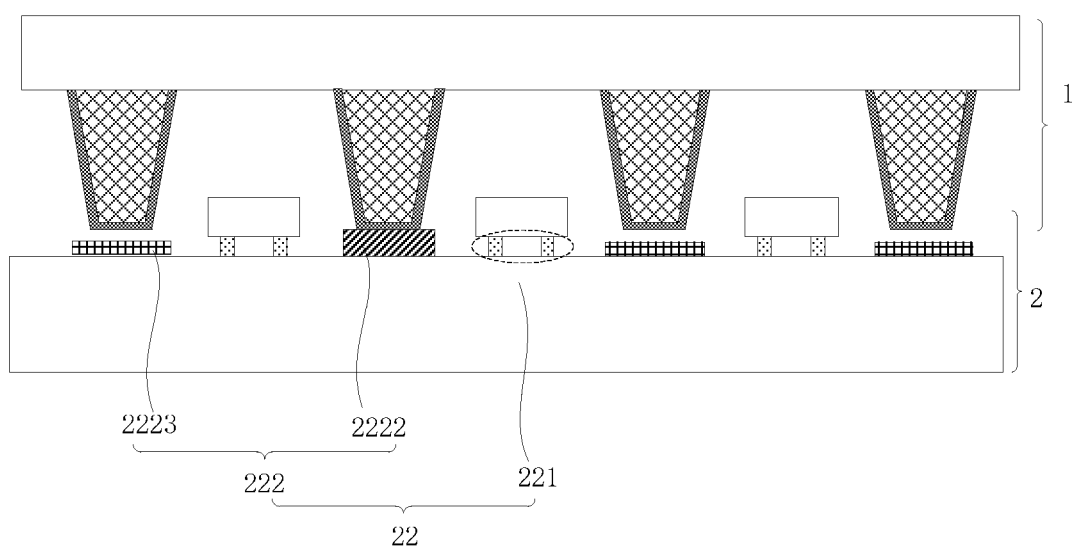
FIG. 15 is a schematic structural view of a display panel provided by another embodiment of the present disclosure.

FIG. 15 is a schematic structural view of a display panel provided by yet another embodiment of the present disclosure. As shown in FIG. 15, the second eutectic layer subsection 222 includes multiple fourth eutectic structures 2222 and multiple fifth eutectic structures 2223. Every two first metal subsections 1311 adjacent in the second direction are both in contact with and electrically connected to one of the multiple fourth eutectic structures 2222, and the multiple second metal subsections 1312 are not in contact with the multiple fifth eutectic structures 2223.

In this embodiment, the optical blocking effect of the second eutectic layer subsection 222 can be improved by disposing the fifth eutectic structures 2223, and meanwhile, independent transmission of the touch signals of the first-type touch electrodes 101 and the second-type touch electrodes 102 can be ensured by disposing the second metal subsections 1312 to be not in contact with the fifth eutectic layer subsections 2223.

Referring to the above description, in the second eutectic layer subsection 222, the fourth eutectic structures 2222 and the fifth eutectic structures 2223 may be integrally disposed or separately disposed, which is not limited in the embodiments of the present disclosure.

The multiple fourth eutectic structures 2222 and the multiple the fifth eutectic structures 2223 are independently disposed.

It should be understood that the fourth eutectic structures 2222 are used for transmitting the touch signals, if the fourth eutectic structures 2222 and the fifth eutectic structures 2223 are integrally disposed, and since the heights of the first eutectic structures 2222 and the fifth eutectic structures 2223 are different, the preparation process of the fourth eutectic structures and the fifth eutectic structures is complex. Therefore, in an exemplary embodiment, the fourth eutectic structures 2222 and the fifth eutectic structures 2223 are independently disposed, the fourth eutectic structures and the fifth eutectic structures are prepared with respective different heights, so that the process difficulty is reduced, and the preparation efficiency is improved.

Figure 16:
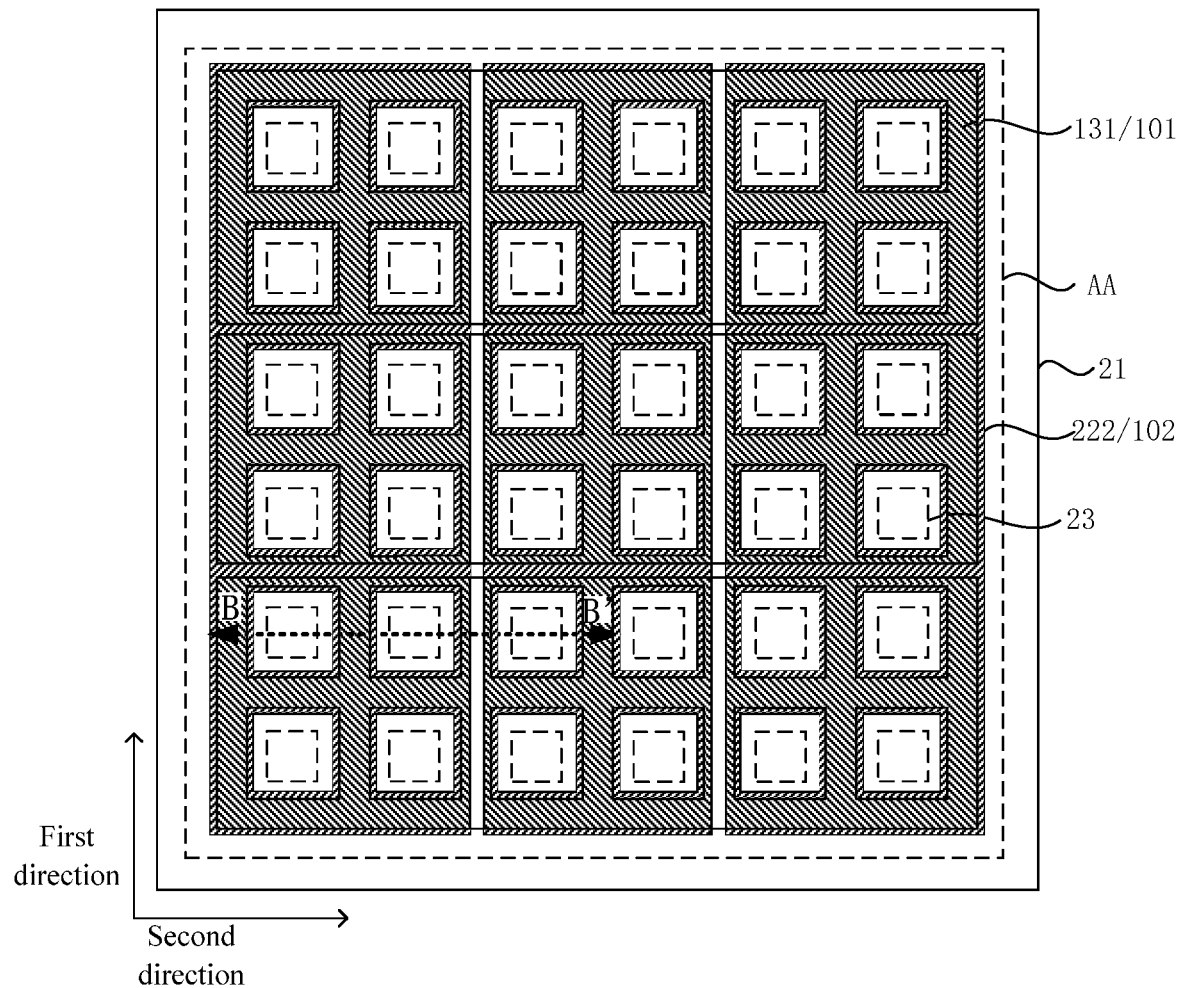
FIG. 16 is a schematic structural view of a touch electrode provided by another embodiment of the present disclosure.
Figure 17:
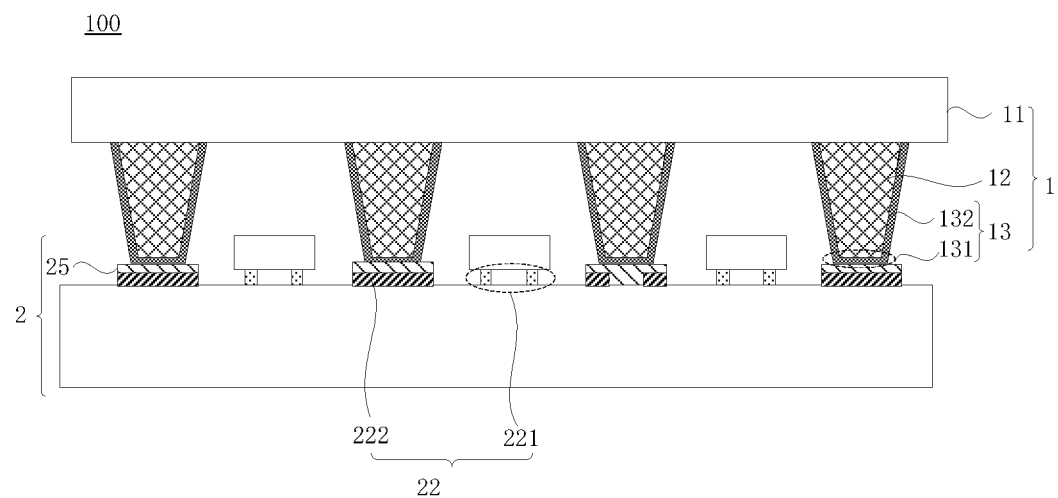
FIG. 17 is a cross-sectional structural view of the display panel taken along BB' of FIG. 16.

The second touch scheme is the mutual-capacitive touch scheme in which the touch driving electrode and the touch sensing electrode are disposed on different layers. As shown in FIGS. 16 to 17, FIG. 16 is a schematic structural view of a touch electrode provided by another embodiment of the present disclosure, and FIG. 17 is a cross-sectional structural view of the display panel taken along BB' of FIG. 16. The first substrate 1 further includes a reflective metal layer 13, the reflective metal layer 13 includes at least a first reflective subsection 131, and the first reflective subsection 131 covers a first surface 121 on a side of the baffle wall layer 12 close to the light-emitting substrate 2; the first reflection subsection 131 is multiplexed as the first-type touch electrode 101, the second eutectic layer subsection 222 is multiplexed as the second-type touch electrode 102, and an insulating layer 25 is disposed between the first reflection subsection 131 and the second eutectic layer subsection 222.

This touch scheme also utilizes the good conductivity of the reflective metal layer 13 and the eutectic layer 22, the difference is in that the reflective metal layer 13 (i.e., the first reflective subsection 131) covering the bottom surface of the baffle wall layer 12 and the second eutectic subsection 222 are respectively multiplexed as one type of touch electrode. As shown in FIG. 16, the first-type touch electrodes 101, which are arranged in the first direction and extend in the second direction, may be formed by patterning the first reflective layer, and the second-type touch electrodes 102, which are arranged in the second direction and extend in the second direction, may be formed by patterning the second eutectic layer subsection 222, and further, as shown in FIG. 17, the independent transmission of touch signals of the first-type touch electrodes 101 and the second-type touch electrodes 102 can be ensured by disposing the insulating layer 25 between the first reflective subsection 131 and the second eutectic layer subsection 222.

Figure 18:
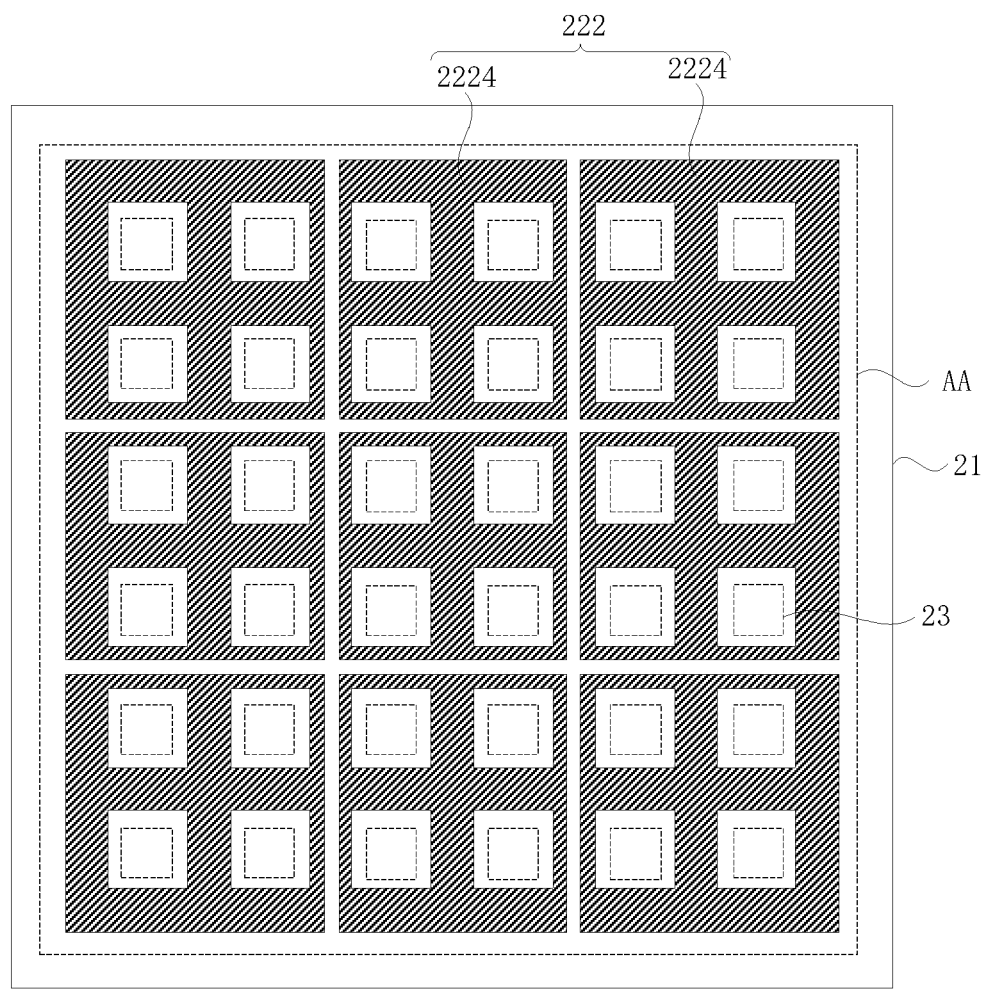
FIG. 18 is a schematic structural view of a touch electrode provided by another embodiment of the present disclosure.

The third touch scheme is the self-capacitive touch scheme. As shown in FIG. 18, and FIG. 18 is a schematic structural view of a touch electrode provided by another embodiment of the present disclosure. The second eutectic layer subsection 222 includes multiple sixth eutectic structures independently disposed, and the multiple sixth eutectic structures are configured to receive a touch driving signal and feed back a touch sensing signal.

In this embodiment, the second eutectic layer subsection 222 is patterned and may be multiplexed as touch electrodes for transmitting the touch driving signal and the touch sensing signal.

In summary, the scheme that the second eutectic layer subsection 222 is multiplexed as the touch electrodes or the cross-bridge structure in the touch layer is described in detail in the above-described embodiments, and the thickness of the display panel can be significantly reduced by adopting the above scheme.

In general, no matter whether the second eutectic layer subsection 222 is used for transmitting the electrical signals or multiplexed as the structure in the touch layer, the second eutectic layer subsection 222 can block the mutual crosstalk of emitted light beams of adjacent micro light-emitting diodes 23, meanwhile, a new function is given to the second eutectic layer subsection 222, therefore, effects such as reducing the thickness of the display panel, simplifying the preparation process of the display panel, and improving the quality of the display panel are achieved.

In an embodiment, the eutectic layer 22 is an indium-containing compound.

The indium-containing compound has good conductivity, which is beneficial to the transmission of electrical signals, meanwhile, which may significantly block light and prevent the mutual crosstalk of emitted light beams of adjacent micro light-emitting diodes 23. Those skilled in the art may select the material of the eutectic layer 22 on their own, which is not limited in the embodiments of the present disclosure.

Figure 19:
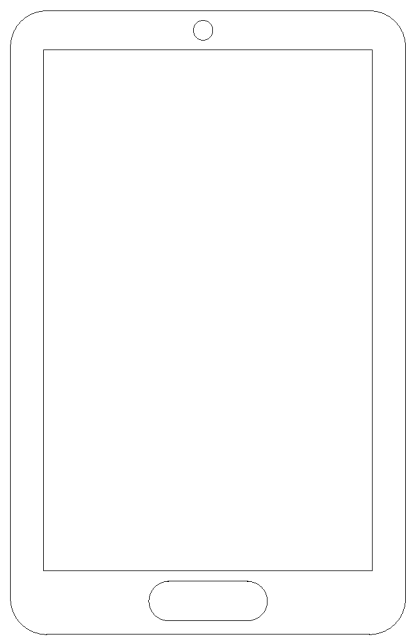
FIG. 19 is a schematic structural view of a display device provided by an embodiment of the present disclosure.

Based on the same inventive concept, the embodiments of the present disclosure further provide a display device. FIG. 19 is a schematic structural view of a display device provided by an embodiment of the present disclosure. The display device 200 includes the display panel provided by any one of the above-described embodiments, so that the display device 200 has the same beneficial effects as the display panel described above. For the similarities, reference may be made to the description of the embodiments of the display panel described above, which is not described in detail herein. The display device 200 provided by the embodiments of the present disclosure may be a mobile phone shown in FIG. 19 or any electronic product with a display function, including but not limited to the following categories: a television, a notebook computer, a desktop display, a tablet computer, a digital camera, an intelligent bracelet, an intelligent glass, a vehicle-mounted display, medical equipment, industrial control equipment, a touch interaction terminal and the like, which is not particularly limited in the embodiments of the present disclosure.

It is to be noted that the above-mentioned contents are only the exemplary embodiments of the present disclosure and the technical principles applied thereto. It is to be understood by those skilled in the art that the present disclosure is not limited to the particular embodiments described herein, and that various variations, rearrangements and substitutions may be made without departing from the protection scope of the present disclosure. Therefore, although the present disclosure has been described in detail with reference to the above embodiments, the present disclosure is not limited to the above embodiments, and may further include other equivalent embodiments without departing from the concept of the present disclosure, and the scope of the present disclosure is defined by the appended claims.

What is claimed is:

1. A display panel, comprising a first substrate and a light-emitting substrate disposed opposite to each other; wherein the first substrate comprises:
a first base comprising a display region; and
a baffle wall layer located on a side of the first substrate and in the display region;
wherein the light-emitting substrate comprises:
a second base;
a eutectic layer located on a side of the second base close to the first substrate; and
a plurality of micro light-emitting diodes located on a side of the eutectic layer close to the first substrate; wherein the eutectic layer comprises a first eutectic layer subsection and a second eutectic layer subsection, the first eutectic layer subsection is electrically connected to the plurality of micro light-emitting diodes, and a vertical projection of the second eutectic layer subsection on a plane where the second base is located at least partially overlaps a vertical projection of the baffle wall layer on the plane where the second base is located.

2. The display panel of claim 1, wherein at least part of the baffle wall layer is in contact with the second eutectic layer subsection.

3. The display panel of claim 1, wherein the baffle wall layer comprises a first surface close to a side of the light-emitting substrate; and
the vertical projection of the second eutectic layer subsection on the plane where the second base is located covers a vertical projection of the first surface on the plane where the second base is located.

4. The display panel of claim 1, wherein the vertical projection of the baffle wall layer on the plane where the second base is located is a first continuous grid;
the vertical projection of the second eutectic layer subsection on the plane where the second base is located is a second continuous grid; and
the first continuous grid at least partially overlaps the second continuous grid.

5. The display panel of claim 1, wherein the vertical projection of the baffle wall layer on the plane where the second base is located is a third continuous grid;
wherein the second eutectic layer subsection comprises a plurality of first eutectic structures, a part of the plurality of first eutectic structures are arranged at intervals in a first direction and extend in a second direction; the other part of the plurality of first eutectic structures are arranged at intervals in the second direction and extend in the first direction; wherein the first direction intersects with the second direction, and the first direction and the second direction are both parallel to a plane where the first base is located; and
a vertical projection of the plurality of first eutectic structures on the plane where the second base is located at least partially overlaps the third continuous grid.

6. The display panel of claim 5, wherein at least two first eutectic structures, which extend in the first direction and are adjacent to each other in the first direction, of the plurality of first eutectic structures are staggered in the second direction, vertical projections of at least two first eutectic structures, which extend in the first direction and are adjacent to each other in the first direction, on a first plane partially overlap, and the first plane is parallel to the first direction and perpendicular to the second base; and
wherein at least two first eutectic structures, which extend in the second direction and are adjacent to each other in the second direction, of the plurality of first eutectic structures are staggered in the first direction, vertical projections of at least two first eutectic structures, which extend in the second direction and are adjacent to each other in the second direction, on a second plane partially overlap, and the second plane is parallel to the second direction and perpendicular to the second base.

7. The display panel of claim 1, wherein the light-emitting substrate further comprises a driving circuit layer located between a film layer where the second base is located and a film layer where the eutectic layer is located; the driving circuit layer comprises a plurality of conductive layers, and at least one of the plurality of conductive layers is provided with a first power signal line;
  at least part of the second eutectic layer subsection is electrically connected to the first power signal line through a first via hole, and the at least part of the second eutectic layer subsection transmits a first power signal.

8. The display panel of claim 1, wherein the light-emitting substrate further comprises a driving circuit layer located between a film layer where the second base is located and a film layer where the eutectic layer is located; the driving circuit layer comprises a plurality of conductive layers, and at least one of the plurality of conductive layers is provided with a second power signal line; and
  at least part of the second eutectic layer subsection is electrically connected to the second power signal line through a second via hole, and the at least part of the second eutectic layer subsection transmits a second power signal.

9. The display panel of claim 1, wherein at least part of the second eutectic layer subsection is electrically connected to a second power signal terminal.

10. The display panel of claim 9, wherein the light-emitting substrate further comprises a driving circuit layer located between a film layer where the second base is located and a film layer where the eutectic layer is located; the driving circuit layer comprises a plurality of conductive layers, and none of the plurality of conductive layers is provided with a second power signal line.

11. The display panel of claim 1, wherein at least part of the second eutectic layer subsection is electrically connected to an electrostatic protection signal terminal.

12. The display panel of claim 8, wherein the first eutectic layer subsection comprises second eutectic structures and third eutectic structures, the second eutectic structures are electrically connected to anodes of the plurality of micro light-emitting diodes, and the third eutectic structures are electrically connected to cathodes of the plurality of micro light-emitting diode; and
  the second eutectic layer subsection transmits a second power signal, and the second eutectic layer subsection is electrically connected to the third eutectic structures.

13. The display panel of claim 1, wherein the first substrate further comprises a reflective metal layer, the reflective metal layer comprises at least a first reflective subsection, and the first reflective subsection covers a first surface on a side of the baffle wall layer close to the light-emitting substrate;
  the first reflective subsection comprises a plurality of first metal subsections and a plurality of second metal subsections; wherein on the first surface, every two adjacent first metal subsections of the plurality of first metal subsections are independently disposed, and every two second metal subsections, which are adjacent in the first direction, of the plurality of second metal subsections are connected to each other; the plurality of first metal subsections are multiplexed as first-type touch electrodes, and the plurality of second metal subsections are multiplexed as second-type touch electrodes; and
  every two first metal subsections, which are adjacent in the second direction, of the plurality of first metal subsections are electrically connected to each other through the second eutectic layer subsection.

14. The display panel of claim 13, wherein the second eutectic layer subsection comprises a plurality of fourth eutectic structures and a plurality of fifth eutectic structures; and
  every two first metal subsections, which are adjacent in the second direction, are both in contact with and electrically connected to one of the plurality of fourth eutectic structures, and the plurality of second metal subsections are not in contact with the plurality of fifth eutectic structures.

15. The display panel of claim 14, wherein the plurality of fourth eutectic structures and the plurality of the fifth eutectic structures are independently disposed.

16. The display panel of claim 1, wherein the first substrate further comprises a reflective metal layer, the reflective metal layer comprises at least a first reflective subsection, and the first reflective subsection covers a first surface on a side of the baffle wall layer close to the light-emitting substrate; and
  the first reflection subsection is multiplexed as a first-type touch electrode, the second eutectic layer subsection is multiplexed as a second-type touch electrode, and an insulating layer is disposed between the first reflection subsection and the second eutectic layer subsection.

17. The display panel of claim 1, wherein the second eutectic layer subsection comprises a plurality of sixth eutectic structures independently disposed, and the plurality of sixth eutectic structures are configured to receive a touch driving signal and feed back a touch sensing signal.

18. The display panel of claim 1, wherein the eutectic layer is an indium-containing compound.

19. A display device, comprising a display panel; wherein the display panel comprises a first substrate and a light-emitting substrate disposed opposite to each other;
  wherein the first substrate comprises:
    a first base comprising a display region; and
    a baffle wall layer located on a side of the first substrate and in the display region;
  wherein the light-emitting substrate comprises:
    a second base;
    a eutectic layer located on a side of the second base close to the first substrate; and
  a plurality of micro light-emitting diodes located on a side of the eutectic layer close to the first substrate; wherein the eutectic layer comprises a first eutectic layer subsection and a second eutectic layer subsection, the first eutectic layer subsection is electrically connected to the plurality of micro light-emitting diodes, and a vertical projection of the second eutectic layer subsection on a plane where the second base is located at least partially overlaps a vertical projection of the baffle wall layer on the plane where the second base is located.

* * * * *